United States Patent
Suh et al.

(10) Patent No.: US 7,381,579 B2
(45) Date of Patent: Jun. 3, 2008

(54) DONOR SHEET, METHOD OF MANUFACTURING THE SAME, METHOD OF MANUFACTURING TFT USING THE DONOR SHEET, AND METHOD OF MANUFACTURING FLAT PANEL DISPLAY DEVICE USING THE DONOR SHEET

(75) Inventors: Min-Chul Suh, Seongnam-si (KR); Nam-Choul Yang, Seoul (KR); Jae-Bon Koo, Yongin-si (KR); Hye-Dong Kim, Seongnam-si (KR); Ho-Kyoon Chung, Yongin-si (KR); Ul-Ho Lee, Yongin-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 210 days.

(21) Appl. No.: 10/995,514

(22) Filed: Nov. 24, 2004

(65) Prior Publication Data

US 2005/0191448 A1    Sep. 1, 2005

(30) Foreign Application Priority Data

Feb. 26, 2004   (KR) .................. 10-2004-0013007
Apr. 19, 2004   (KR) .................. 10-2004-0026647

(51) Int. Cl.
*H01L 21/00*    (2006.01)

(52) U.S. Cl. .................. 438/22; 438/149; 428/411.1; 977/773

(58) Field of Classification Search .............. 438/28, 438/30, 34, 149–167, 22; 428/411.1, 688, 428/689, 690; 977/742, 753, 762–764, 767, 977/770, 784, 785, 811, 827, 700, 733; 345/87, 345/92

See application file for complete search history.

(56) References Cited

U.S. PATENT DOCUMENTS

| | | | | |
|---|---|---|---|---|
| 5,851,709 A | * | 12/1998 | Grande et al. | 430/7 |
| 2003/0206436 A1 | | 11/2003 | Eaton, Jr. et al. | |
| 2004/0191564 A1 | * | 9/2004 | Kim et al. | 428/690 |
| 2005/0082523 A1 | * | 4/2005 | Blanchet-Fincher et al. | 257/40 |

FOREIGN PATENT DOCUMENTS

CN    1423512    6/2003

OTHER PUBLICATIONS

U.S. Appl. No. 60/483,866, filed Jun. 26, 2003.*

(Continued)

*Primary Examiner*—Brook Kebede
(74) *Attorney, Agent, or Firm*—Robert E. Brushnell, Esq.

(57) ABSTRACT

A flexible flat panel display where nanoparticles are used for an active layer and the substrate is a flexible plastic, a method of manufacturing the same, a method of manufacturing a thin film transistor (TFT) using the donor sheet, and a method of manufacturing a flat panel display device using the donor sheet. In making the TFTs in the display, a donor sheet is used to transfer the nanoparticles from the sheet to the substrate. The donor sheet can be manufactured at room temperature. The donor sheet has a base film, and a transfer layer being disposed at one side of the base film and transferable, wherein the transfer layer has a plurality of nanoparticles which are arranged to be approximately parallel to one another.

29 Claims, 12 Drawing Sheets

OTHER PUBLICATIONS

Doping and Electrical Transport in Silicon Nanonwires, by Yi Cui et al., published in *The Journal of Physical Chemistry B*, vol. 104, No. 22, Jun. 8, 2000.

Synthesis of p-Type Gallium Nitride Nanowires for Electronic and Photonic Nanodevices, by Zhaohui Zhong, published in *Nano Letters*, vol. 3, No. 3, pp. 343-346 on Feb. 20, 2003.

Low-Temperature Synthesis of Single-Crystal Germanium Nanowires by Chemical Vapor Deposition, by Dunwei Wang et al., published in the *Angew. Chem. Int. Ed.* 2002, 41, No. 24, p. 4783.

Idium Phosphide Nanowires as Building Blocks for Nanoscale Electronic and Optoelectronic Devices, by Xiangfeng Duan et al., published in *Letters to Nature*.

Rectifying Behavior of Electrically Aligned ZnO Nanorods, by Oliver Harnack, et al., *Nano Letters*, vol. 3, No. 8, pp. 1097-1108 published on Jun. 24, 2003.

*Comparative Study of Dodecanethiol-Derivatized Silver Nanoparticles Prepared in One-Phase and Two-Phase Systems*, by So Young Kang et al., Langmuir 1998, vol. 14, pp. 226-230, published Jan. 6, 1998.

Chinese Office action from the State Intellectual Property Office of People's Republic of China issued in Applicant's corresponding Chinese Patent Application No. 200410081921.1 dated Sep. 14, 2007 (along with an English language translation).

* cited by examiner

DONOR SHEET, METHOD OF MANUFACTURING THE SAME, METHOD OF MANUFACTURING TFT USING THE DONOR SHEET, AND METHOD OF MANUFACTURING FLAT PANEL DISPLAY DEVICE USING THE DONOR SHEET

CLAIM OF PRIORITY

This application makes reference to, incorporates the same herein, and claims all benefits accruing under 35 U.S.C. §119 from applications earlier filed in the Korean Intellectual Property Office on 26 Feb. 2004 and 19 Apr. 2004 and there duly assigned Serial nos. 2004-13007 and 2004-26647, respectively.

BACKGROUND OF THE INVENTION

1. Field of the Invention

The present invention relates to a donor sheet, a method of manufacturing the same, a method of manufacturing a flexible thin film transistor (TFT) using the donor sheet where the active layers are made out of nanoparticles, and a method of manufacturing a flat panel display device using the donor sheet, and more particularly, to a donor sheet in which nanoparticles are arranged to be parallel to one another, a method of manufacturing the same, a method of manufacturing a thin film transistor (TFT) using the donor sheet, and a method of manufacturing a flat panel display device using the donor sheet.

2. Description of the Related Art

A flat panel display device such as a liquid crystal display (LCD), an organic light-emitting diode (OLED) display, or an inorganic light-emitting diode display are categorized by driving methods into a passive matrix (PM) flat panel display device using a passive driving method and an active matrix (AM) flat panel display device using an active driving method.

In the PM flat panel display device, anodes and cathodes, respectively, are arranged in a plurality of columns and rows, and a scanning signal is supplied by a row driving circuit to the cathodes. In this case, only one row of the plurality of rows is selected. In addition, a data signal is input by a column driving circuit into each pixel. The AM flat panel display device is widely used as a display device, which controls a signal input into each pixel using a thin film transistor (TFT) and is able to process an enormous amount of signals to realize a moving image.

TFTs of the AM flat panel display device include a semiconductor active layer having source/drain regions doped with high-concentration impurities and a channel region formed between the source/drain regions, gate electrodes insulated from the semiconductor active layer and placed in a region corresponding to the channel region, and source/drain electrodes each contacting each of the source/drain regions.

The semiconductor active layer is generally formed of amorphous silicon or polycrystalline silicon. Amorphous silicon can be deposited at a low temperature. However, when the semiconductor active layer is formed of amorphous silicon, electrical characteristics and reliability are lowered, and the region of a display device cannot be easily increased. In these days, polycrystalline silicon is widely used in forming the semiconductor active layer. Polycrystalline silicon has high current movement of several tens to hundreds $cm^2/V \cdot s$ and low radio frequency operating characteristics and a low leakage current value and thus is very suitable for use in a high definition and large-sized flat panel display device.

However, when the semiconductor active layer is formed of polycrystalline silicon, a crystallization process of crystallizing amorphous silicon into polycrystalline silicon needs to be carried out. This involves heating to a high-temperature of 300° C. or higher.

Preferably, flat panel display devices should be able to bend to some degree by applying a predetermined tension thereto, allowing for a sufficient view angle, or so that the display can be used in a portable product such as an arm band, a wallet, or a notebook computer. However, when a TFT is formed of polycrystalline silicon using a conventional method, it is difficult to acquire a flexible flat panel display device. In other words, in order to process a flexible product, flexible materials such as acryl, polyimide, polycarbonate, polyester, mylar, and other plastic materials, should be used in most elements including the substrate. These plastic materials have low heat resistance, and if present when polycrystalline is formed, these materials will not tolerate the heat well. Thus, in order to process TFTs of the flat panel display device used in the flexible product, a method to form a structure at a temperature in which the plastic materials can withstand is needed.

SUMMARY OF THE INVENTION

It is therefore an object of the present invention to provide an improved AM flat panel display structure.

It is also an object of the present invention to provide a method for making the improved AM flat panel display structure.

It is further an object to provide a method for making an AM flat panel display that is both flexible and has superior electrical characteristics.

It is still an object to provide a method for making the flexible flat panel display.

It is yet an object of the present invention to provides a method of manufacturing a thin film transistor (TFT) having superior electrical characteristics, the method being achieved at room temperature and without the application of heat.

These and other objects can be achieved by a TFT, a flat panel display with TFTs where the active region uses nanoparticles. The nanoparticles can be applied to a substrate from a donor sheet. The donor sheet includes a base film, and a transfer layer being disposed at one side of the base film and being transferable to another object like a substrate, the transfer layer having nanoparticles formed thereon and in parallel with each other.

According to another aspect of the present invention, there is provided a method of manufacturing the donor sheet, the method including preparing a film, forming first high molecular fibers that are absent of nanoparticles, forming second high molecular fibers containing a plurality of nanoparticles arranged in parallel to each other, forming a woven fabric so that the first fibers and the second fibers cross one another, and laminating the woven fabric to the film.

According to still another aspect of the present invention, there is provided a method of manufacturing a thin film transistor having a semiconductor active layer, the method including partitioning a plurality of nanoparticle lines, preparing a donor sheet having a transfer layer on a woven fabric in which a plurality of nanoparticles are arranged to be approximately parallel to one another, and forming the active layer by aligning the donor sheet with a substrate, the substrate being an acceptor, so that the nanoparticles of the donor sheet are parallel to the nanoparticle lines, and transferring the transfer layer from the donor sheet to the nanoparticle lines on the substrate.

According to yet another aspect of the present invention, there is provided a method of manufacturing a flat panel display device having an emission region in which a plurality of pixels are disposed and a selection driving circuit including a thin film transistor having a semiconductor active layer disposed in each of the pixels, the method including partitioning a plurality of nanoparticle lines, preparing a donor sheet having a transfer layer on a woven fabric in which a plurality of nanoparticles are arranged to be approximately parallel to one another, and forming the active layer by aligning the donor sheet to a substrate, the substrate being an acceptor so that the nanoparticles of the donor sheet are parallel to the nanoparticle lines on the substrate, and transferring the transfer layer from the donor sheet to the substrate along the nanoparticle lines.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

As a preliminary matter, as used herein, the term (TMS)$_2$Se means bis(trimethylsillyl)selenium; the term TOPSe means (Tri-n-octylphosphine)selenide, and the term TBPSe means (Tributylphosphine)selenide.

Figure 1:
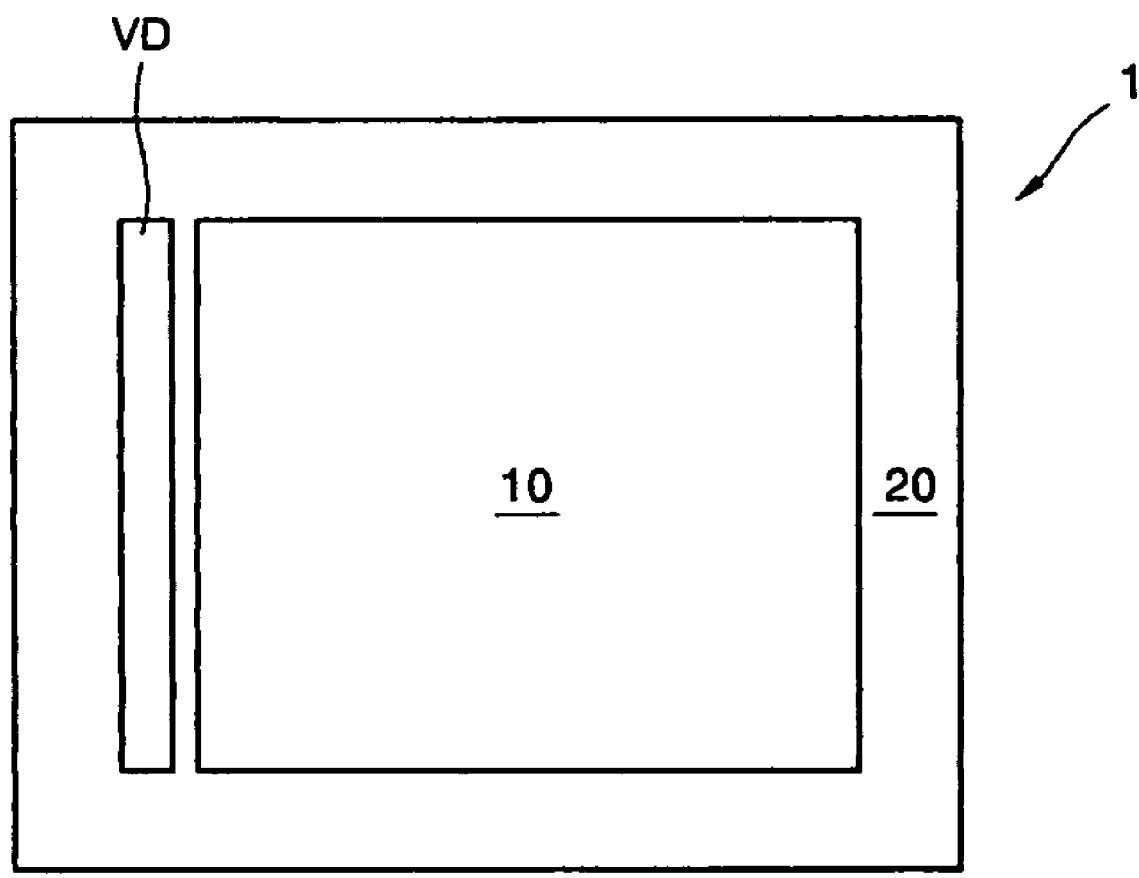
FIG. 1 is a schematic plane view of a flat panel display device according to an embodiment of the present invention.

Turning now to the figures, FIG. 1 is a schematic diagram of an emission region 10 and a non-emission region 20 of an OLED flat panel display 1. A plurality of subpixels in which an OLED and a selection driving circuit are disposed, are located in the emission region 10 of display 1. A horizontal driver (HD) and/or a vertical driver (VD) for driving the subpixels is located in the non-emission region 20. FIG. 1 shows only the VD within the non-emission region 20, but a plurality of circuits such as the HD or a level shifter etc may also be disposed in the non-emission region 20. In addition, a terminal portion connected to an external circuit and a sealing portion for sealing the emission region 10 are located in the non-emission region 20.

Figure 2:
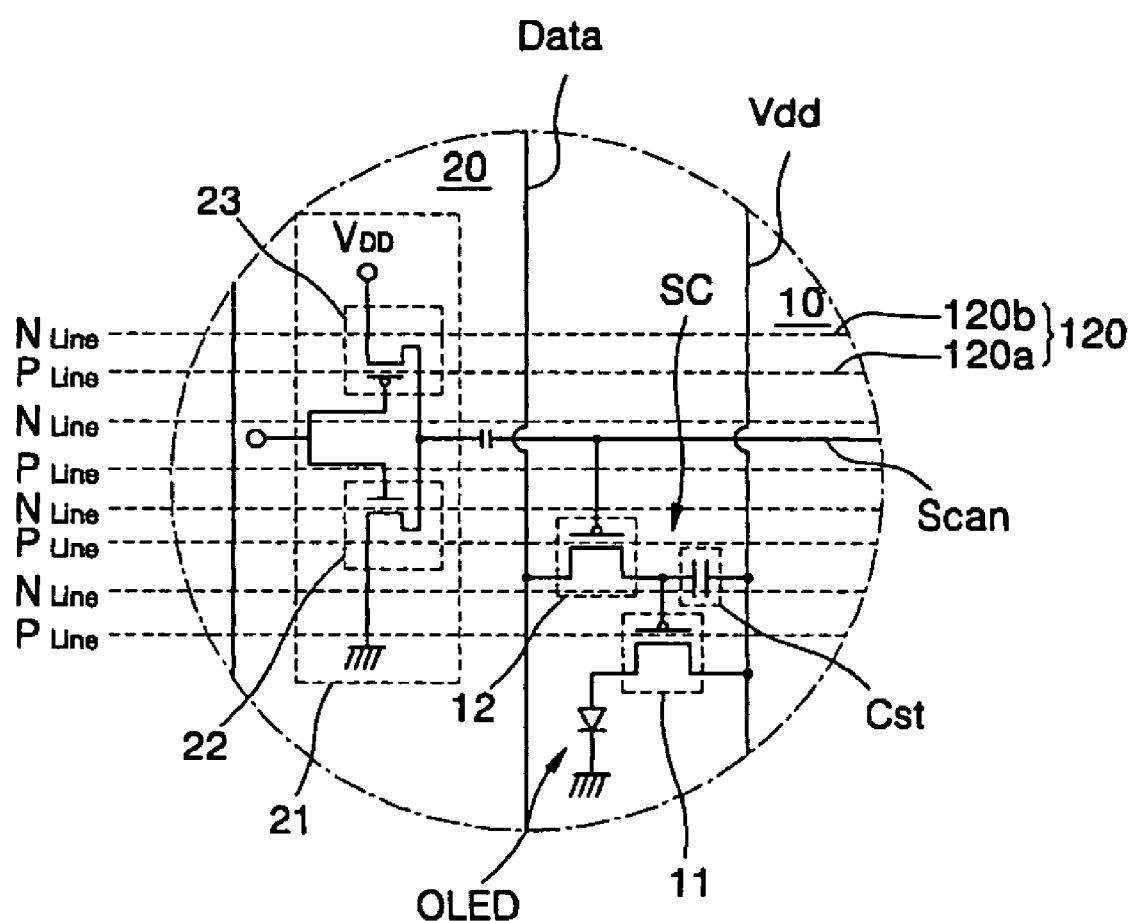
FIG. 2 is a circuit diagram of circuits disposed in an emission region and a non-emission region of the flat panel display of FIG. 1.

Turning now to FIG. 2, FIG. 2 is a schematic circuit diagram of a selection driving circuit (SC) of a unit pixel disposed in the emission region 10 and a CMOS TFT 21 in a vertical driver (VD) disposed in the non-emission region 20 of an OLED according to an embodiment of the present invention. The circuit diagram is not limited to that illustrated in FIG. 2, but the present invention that will be described later may be applied to a variety of circuit structures.

In an embodiment shown in FIG. 2, P-type nanoparticle lines $P_{Line}$ (120a) and N-type nanoparticle lines $N_{Line}$ (120b) are arranged in a striped shape, extend in a plurality of rows and are partitioned off. Lengthwise directions of at least channel regions of the TFTs are parallel to the nanoparticle lines 120. The P-type and N-type nanoparticle lines 120 are virtual lines partitioned off on a substrate, so as to dispose at least channel regions of the TFTs. Thus, TFTs need not be formed in all of the P-type and N-type nanoparticle lines 120 and may be or not be formed along the nanoparticle lines 120.

Nanoparticles, which serve as a channel of a semiconductor active layer on the nanoparticle lines 120, are situated along the nanoparticle lines 120. That is, the nanoparticles may be printed along the nanoparticle lines 120 during a manufacturing process. More detailed descriptions thereof will now be described.

Figure 3:
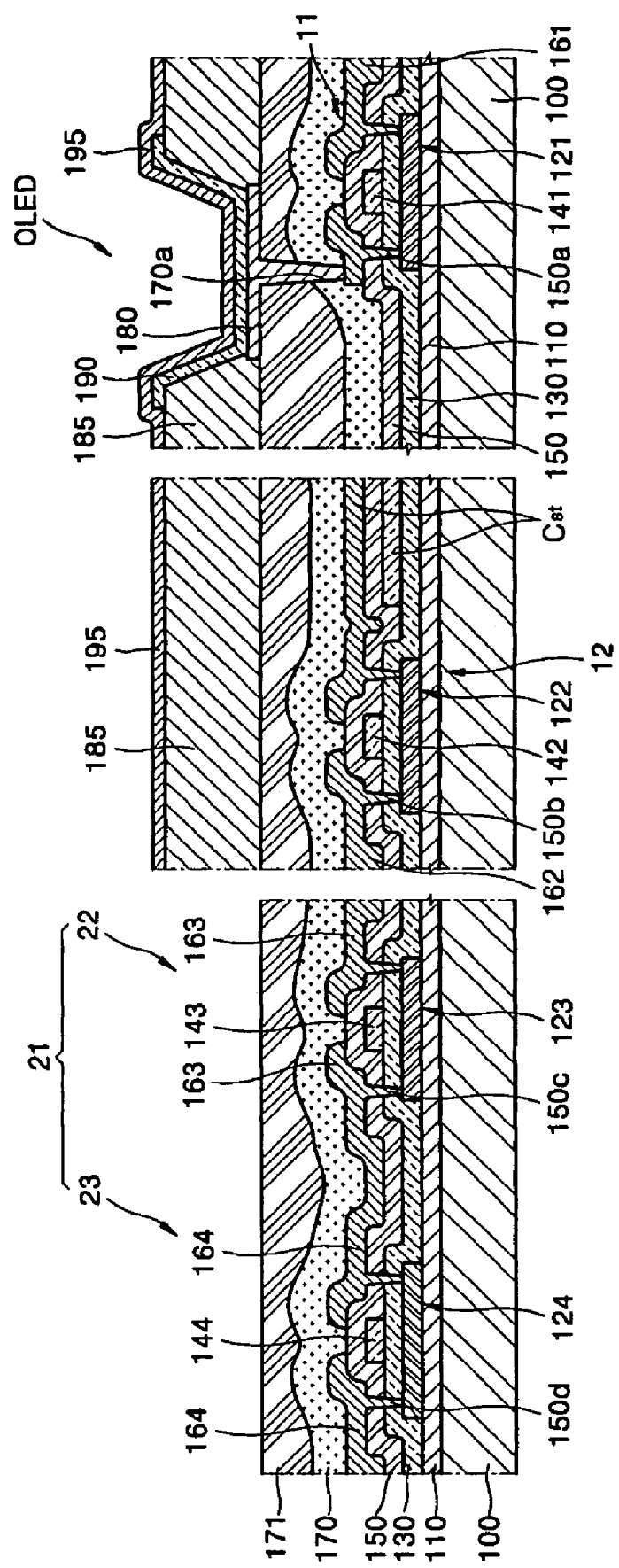
FIG. 3 is a cross-sectional view of an emission region and a non-emission region of various TFTs and an OLED of FIG. 2.

Turning now to FIG. 3, FIG. 3 is a cross-sectional view of FIG. 2, illustrating cross sections of driving TFT 11, switching TFT 12 and a CMOS TFT 21 of a vertical driver (VD). The CMOS TFT 21 is arranged so that an N-type TFT 22 and a P-type TFT 23 are combined with each other. The above-described VD may not include only the CMOS TFT 21. A variety of TFTs and circuits may be interconnected to one another to constitute a driving circuit. The TFTs 11, 12, 22 and 23 are formed on a substrate 100 and arranged on the above-described nanoparticle lines.

The substrate 100 maybe formed of acryl, polyimide, polycarbonate, polyester, mylar, or other plastic materials but is not limited to this to allow for flexibility. The substrate 100 may be formed of glass etc. A buffer layer 110 for preventing diffusion of impurity ions may be selectively disposed on the substrate 100 as occasion demands. In addition, nano-structure that has been already formed using physical and chemical methods are arranged and patterned along the nanoparticle lines arranged on the substrate 100 such that at least a channel of each of a plurality of semiconductor active layers 121, 122, 123, and 124 of each of the TFTs 11, 12, 22, and 23 is formed.

As shown in FIG. 3, a gate insulating layer 130 is made of silicon oxide and/or silicon nitride on the plurality of semiconductor active layers 121, 122, 123, and 124, each semiconductor active layer being formed of nanoparticles. Gate electrodes 141, 142, 143, and 144 of each of the TFTs 11, 12, 22, and 23 are formed on the gate insulating layer 130 through conductive metallic layers such as MoW, Al, Cr, Al/Cu, and Ti/Al/Ti, etc.

An interlevel dielectric (ILD) layer 150 formed of silicon oxide and/or silicon nitride is formed on the gate insulating layer 130 and the gate electrodes 141, 142, 143, and 144, and source/drain electrodes 161, 162, 163, and 164 of each of the TFTs 11, 12, 22, and 33 are disposed on the ILD layer 150 to be insulated from the gate electrodes 141, 142, 143, and 144. The source/drain electrodes 161, 162, 163, and 164 are formed of conductive metallic layers such as MoW, Al, Cr, Al/Cu, and Ti/Al/Ti, etc or conductive polymer. In addition, the source/drain electrodes 161, 162, 163, and 164, respectively, are connected to source/drain regions of each of the active layers 121,122, 123, and 124 through contact holes 150a, 150b, 150c, and 150d so that a TFT results. When forming the gate electrodes 141, 142, 143, and 144 and the source/drain electrodes 161, 162, 163, and 164, a storage capacitor Cst can be formed at the same time and of the same material as a material used to make the TFTs.

A passivation layer 170 made of silicon oxide and/or silicon nitride etc. is formed on the source/drain electrodes 161, 162, 163, and 164, and a planarization layer 171 is made of acryl, BCB, or polyimide is formed over the passivation layer 170. Via hole 170a perforates both the passivation layer 170 and the planarization layer 171 so that any one of the source and drain electrodes 161 of the driving TFT 11 is electrically exposed through the via hole 170a. The passivation layer 170 and the planarization layer 171 are not limited to that described above and may be combined into just one layer.

A pixel electrode 180, which is a lower electrode layer of the OLED, is formed on the passivation layer 171. The pixel electrode 180 is connected to one of the source and drain electrodes 161 through the via hole 170a.

A pixel definition layer 185 is made of an insulating material like an organic material such as acryl, BCB, or polyimide or an inorganic material such as silicon oxide or silicon nitride. As shown in FIG. 2, the pixel definition layer 185 covers TFTs such as the driving TFT 11 and the switching TFT 12 of the selection driving circuit SC and has an opening through which a predetermined part of the pixel electrode 180 is exposed.

An organic film 190, having an emission layer, is coated on the opening through which the pixel electrode 180 is exposed. The organic film 190 may be formed on the entire surface of the 1 I pixel definition layer 185. In this case, the emission layer of the organic film 190 is patterned with red, green, and blue colors in each pixel so that full colors can be realized.

As shown in FIG. 3, the pixel definition layer 185 may not be formed in the non-emission region 20 where the vertical and/or horizontal driver are located, but in no way is the present invention limited to such a configuration.

After the organic film 190 is formed, a common electrode 195, which serves as a lower electrode layer of the OLED, is formed. The common electrode 195 may be formed to cover all pixels but is not limited to this constraint and may be patterned. The pixel electrode 180 and the common electrode 195 may be insulated from each other by the organic film 190, and voltages of different polarities are applied across the organic film 190 so that light can be emitted from the organic layer 190.

The pixel electrode 180 serves as an anode, and the common electrode 195 serves as a cathode, however, it is conceivable to do the opposite. The pixel electrode 180 may be a transparent electrode or a reflection electrode. The transparent electrode may be made out of ITO (indium tin oxide), IZO (indium zinc oxide), ZnO or $In_2O_3$, and after a reflection layer of Ag, Mg, Al, Pt, Pd, Au, Ni, Nd, Ir, Cr and a compound thereof is formed, the reflection electrode using ITO, IZO, ZnO or $In_2O_3$ may be formed on the reflection layer.

The common electrode 195 may also be a transparent electrode or a reflection electrode. When the transparent electrode is used as the common electrode 195, since the common electrode 195 is used as a cathode, metals having a small work function, such as Li, Ca, LiF/Ca, LiF/Al, Al, Mg, and a compound thereof are deposited to direct the organic film 190, an auxiliary electrode layer or a bus electrode line may be formed of a material used for the transparent electrode, such as ITO, IZO, ZnO or $In_2O_3$. The reflection electrode is formed by depositing metals such as Li, Ca, LiF/Ca, LiF/Al, Al, Mg, and a compound thereof on the entire surface of the OLED.

The organic film 190 may be a low or high molecular organic layer. When the low molecular organic layer is used for the organic film 190, the low molecular layer is formed by stacking a hole injection layer (HIL), a hole transport layer (HTL), an emission layer (EML), an electron transport layer (ETL), and an electron injection layer (EIL) in a single or composite structure, and a variety of organic materials, such as copper phthalocyanine (CuPc), N,N'-Di(naphthalene-1-yl)-N,N'-diphenyl-benzidine (NPB), and tris-8-hydroxyquinoline aluminum ($Alq_3$) may be used for the lower molecular organic layer. These low molecular organic layers are formed by vapor deposition.

When the high molecular organic layer is used for the organic film 190, the high molecular organic layer may have generally a structure in which the HTL and the EML are formed. In this case, PEDOT is used for the HTL, and high molecular organic materials such as Poly-Phenylenevinylene and Polyfluorene are used for the EML. These high molecular organic layers are formed by screen printing or ink-jet printing etc.

Nanoparticles, that are located in the active layers of the TFTs 11, 12, 22, and 23 found in both the emission region 10 and in drivers of the non-emission region 20, are preferably nanowires extending in a lengthwise direction. At least one or more nanoparticles may be disposed in each active layer of each TFT. A channel of an active layer is designed to be parallel to the lengthwise direction of the nanowires. In no way is the present invention limited to this. The nanoparticles may instead be nano-ribbons, nanorods, or nanotubes and nanoparticles that can be formed in the lengthwise direction.

Figure 4:
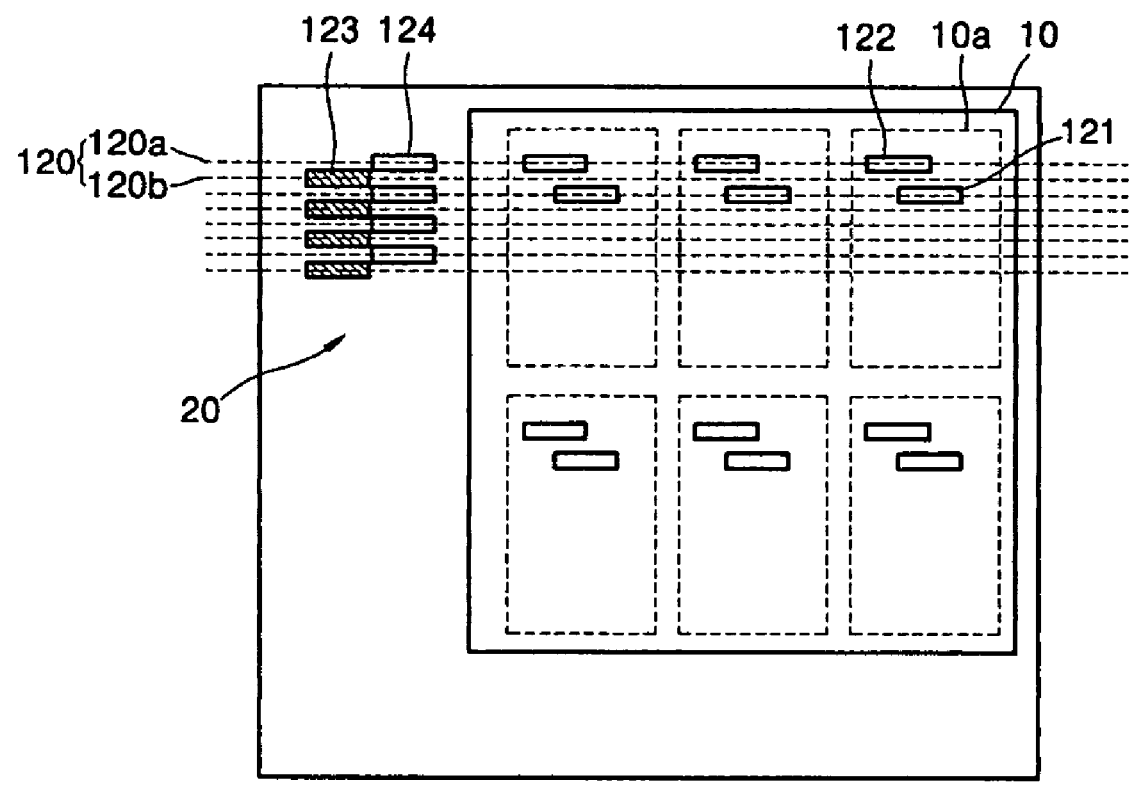
FIG. 4 is a schematic plane view of active layers of the flat panel display device according to an embodiment of the present invention.

In the present invention, active layers 121, 122, 123, and 124 are formed of nanoparticles as described above. As shown in FIG. 4, these active layers are arranged along nanoparticle lines 120 having a striped lengthwise direction. The nanoparticle lines 120 include P-type nanoparticle lines 120a and N-type nanoparticle lines 120b and may have not only a striped shape but also a variety of shapes such as a curved etc.

The active layers 121 of the driving TFT 11, the active layers 122 of the switching TFT 12, and the active layers 124 of the P-type TFT 23 of the CMOS TFT 21, which are all P-type active layers, are arranged along the P-type nanoparticle lines 120a. The active layers 123 of the N-type TFT 22 of the CMOS TFT 21 is arranged along the N-type nanoparticle lines 120b.

The P- and N-type classification is not limited to the above and may be changed according to the design of a selection driving circuit in each unit pixel 10a and circuit design of a driver in the non-emission region 20. That is, any one of the active layers 121 of the driving TFT 11 of the selection driving circuit SD in the unit pixel 10a and the active layers 122 of the switching TFT 12 or both of them may be of N-type. When two or more TFTs are used for the selection driving circuit SC, both P-type and N-type active layers may be present in a single unit pixel 10a. Even in this case, the active layers of each TFT are arranged and installed along the P-type nanoparticle lines 120a and the N-type nanoparticle lines 120b, as shown in FIG. 4.

As illustrated in FIG. 4, the P-type nanoparticle lines 120a and the N-type nanoparticle lines 120b do not overlap each other. Preferably, the P-type nanoparticle lines 120a and the N-type nanoparticle lines 120b are alternately arranged. Thus, the P-type and N-type active layers 121, 122, 123, and 124 of the TFTs arranged and installed along the nanoparticle lines 120 are not arranged and installed on a single line. In other words, as shown in FIG. 4, the P-type active layers 121 of the driving TFT 11, the P-type active layers 122 of the switching TFT 12, and the P-type active layers 124 of the P-type TFT 23 of the CMOS TFT 21 may be arranged and installed on the same P-type nanoparticle lines 120a. However, the P-type active layers 121, 122, and 124 and the N-type active layer 123 of the N-type TFT 22 of the N-type CMOS TFT 21 are arranged and installed on the P-type nanoparticle lines 120a and the N-type nanoparticle lines 120b, which are separated from one another.

By arranging the nanolayers this way, the same type of TFTs among the TFTs disposed in the emission region 10 and the non-emission region 20 are disposed in such a way that lengthwise directions of at least their channel regions are parallel to each another. That is, as shown in FIG. 4, the active layers 121 of the driving TFT 11, the active layers 122 of the switching TFT 12, and the active layers 124 of the P-type TFT 23 of the CMOS TFT 21, which are all P-type active layers, are arranged and installed to be parallel to each another, and the active layers 123 of the N-type TFT 22 of the CMOS TFT 23 are arranged and installed to be parallel to one another. Although just the P-type TFT 23 is disposed in the emission region 10, even though the N-type TFT 22 is disposed in the emission region 10, the N-type TFTs disposed in the non-emission region 20 and active layers thereof are arranged to be parallel to one another. As shown in FIG. 4, the P-type and N-type TFTs are parallel to each other.

Figure 5:
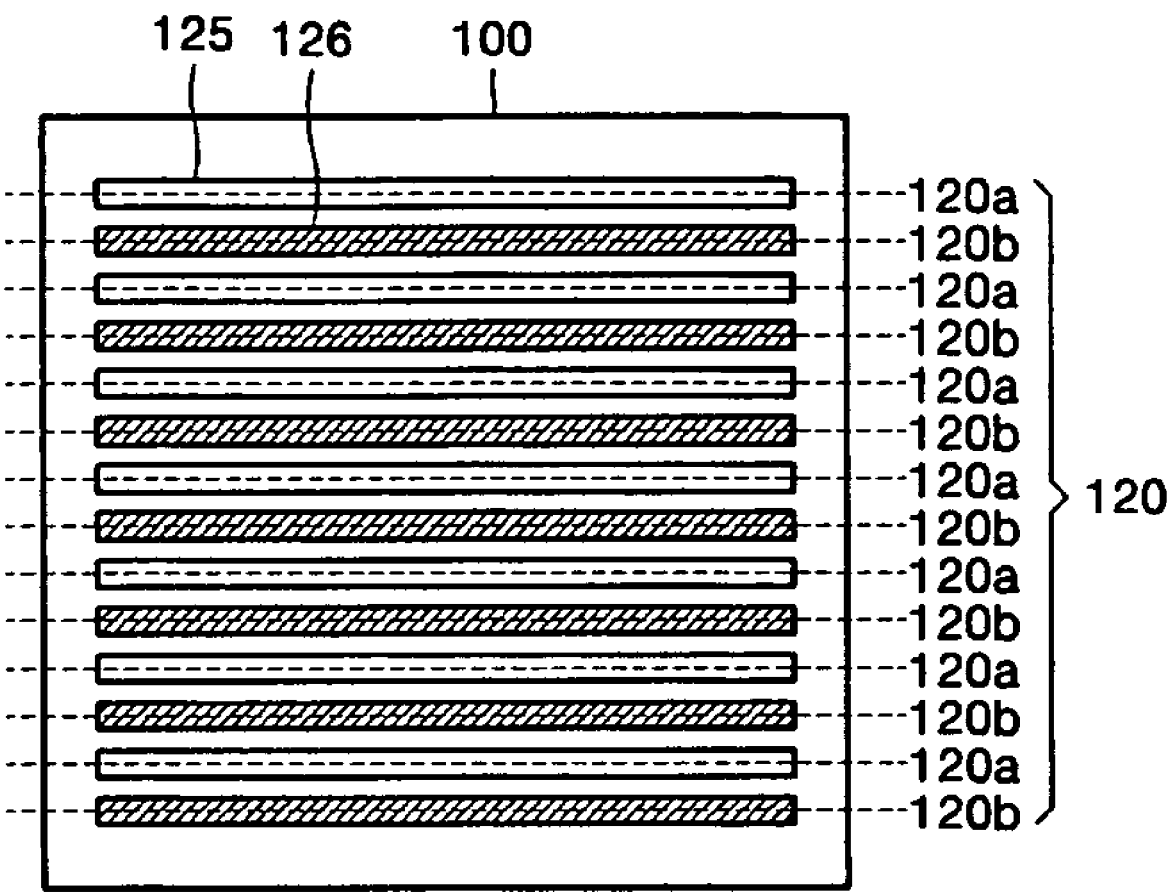
FIG. 5 is a plane view illustrating the state in that nanolayers for forming the active layers are formed.

Turning now to FIG. 5, FIG. 5 illustrates a P-type nanolayer 125 made up of P-type nanoparticles formed along the P-type nanoparticle lines 120a on the substrate 100, and a N-type nanolayer 126 made up of N-type nanoparticles formed along the N-type nanoparticle lines 120b on the substrate 100. As shown in FIG. 4, the active layers 121, 122, 123, and 124 may be formed by patterning the nanolayers 125 and 126 according to their design patterns. The P-type and N-type nanolayers 125 and 126 maybe formed in a striped shape, as shown in FIG. 5. The nanolayers 125 and 126 shown in FIG. 5 may be formed by various methods. For example, the nanolayers 125 and 126 may be formed by a laser induced thermal imaging (LITI) method.

Figure 6A:
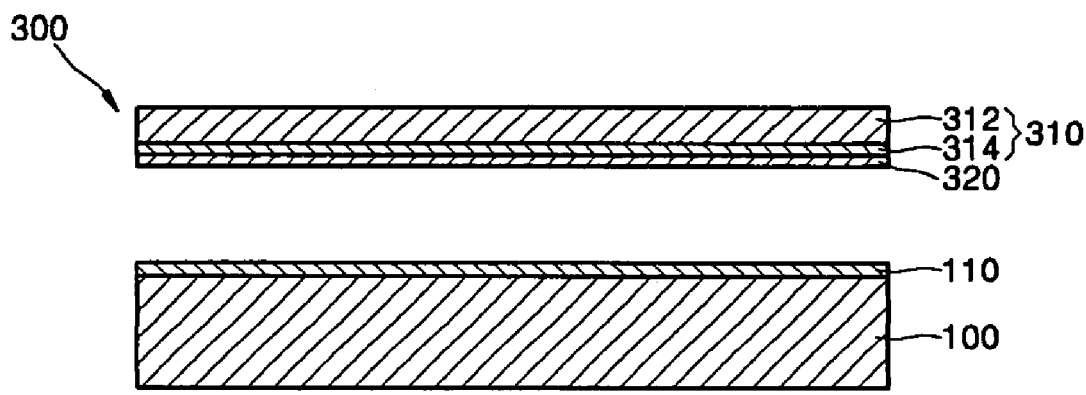
FIGS. 6A through 6C, respectively, are cross-sectional views illustrating a laser induced thermal imaging (LITI) method as an example of a method of forming the nanolayers shown in FIG. 5 according to an embodiment of the present invention.
Figure 6B:
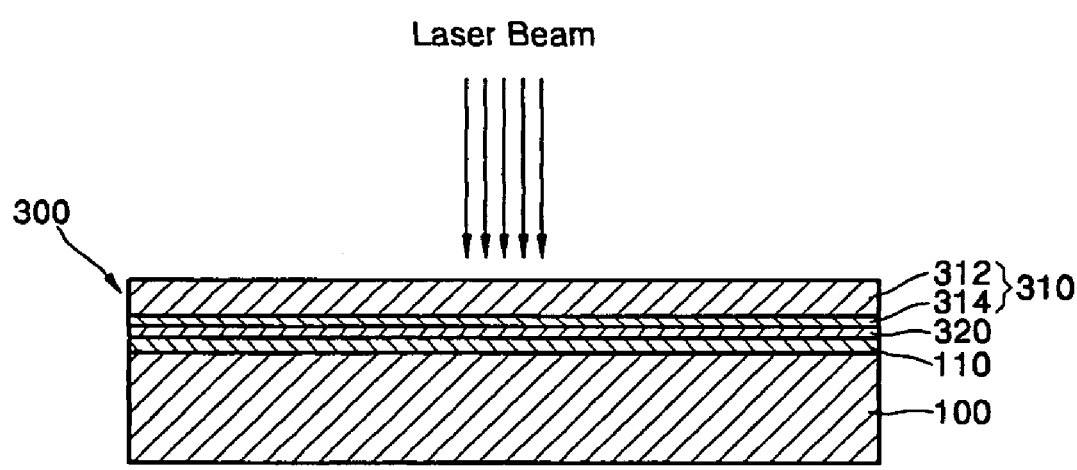
Figure 6C:
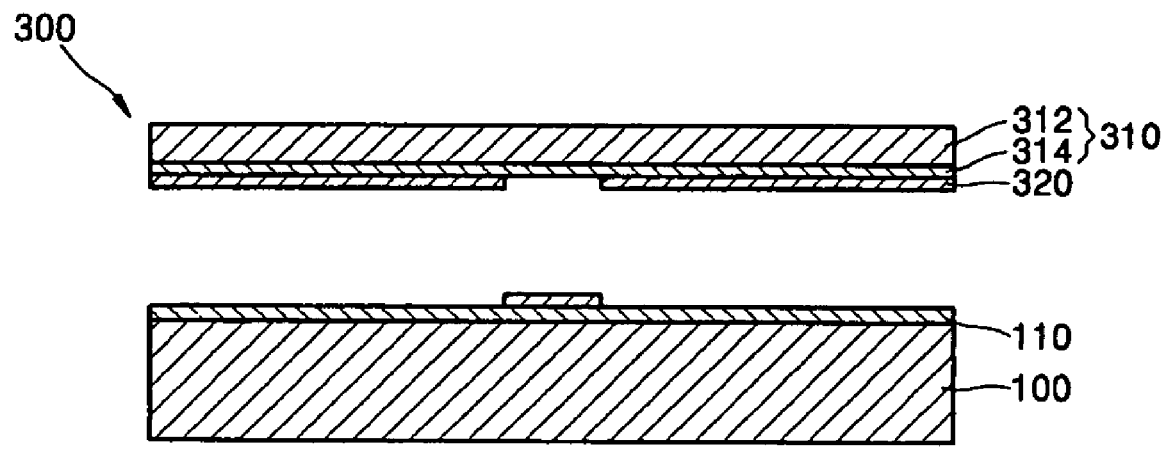
Figure 7:
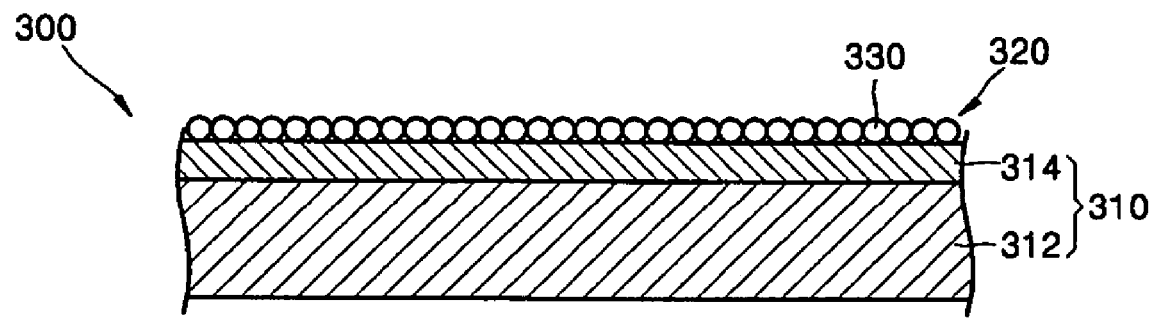
FIG. 7 is a cross-sectional view of a donor sheet used in the method shown in FIGS. 6A through 6C.
Figure 11:
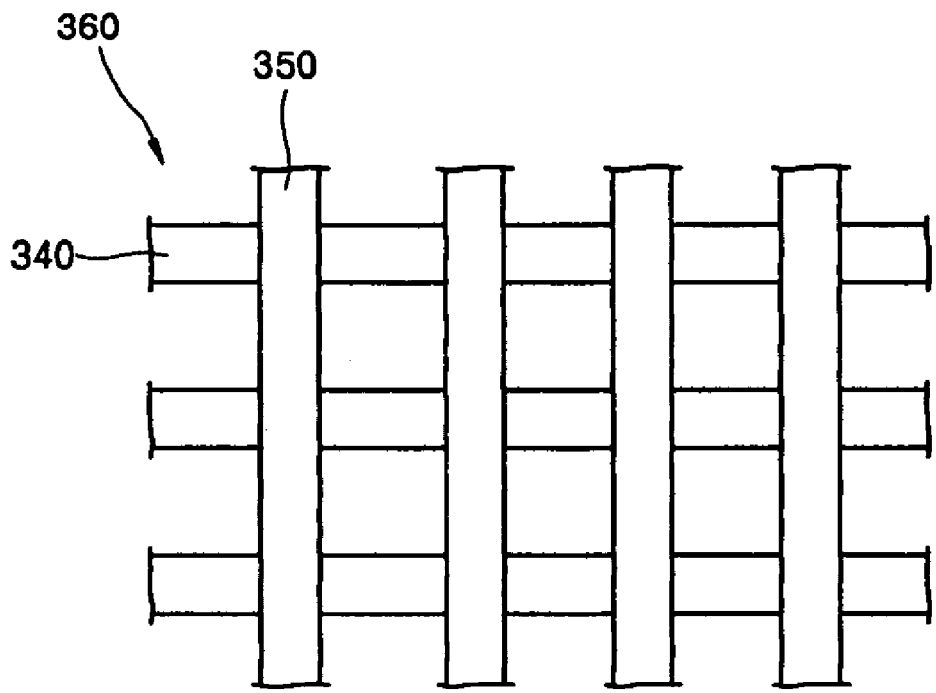
Figure 12:
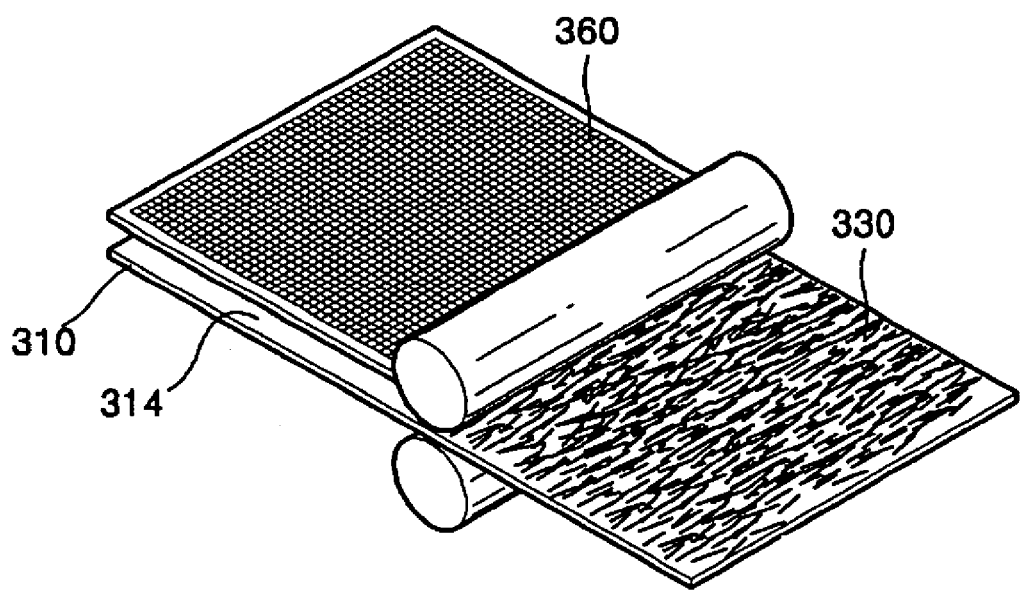
Figure 13:
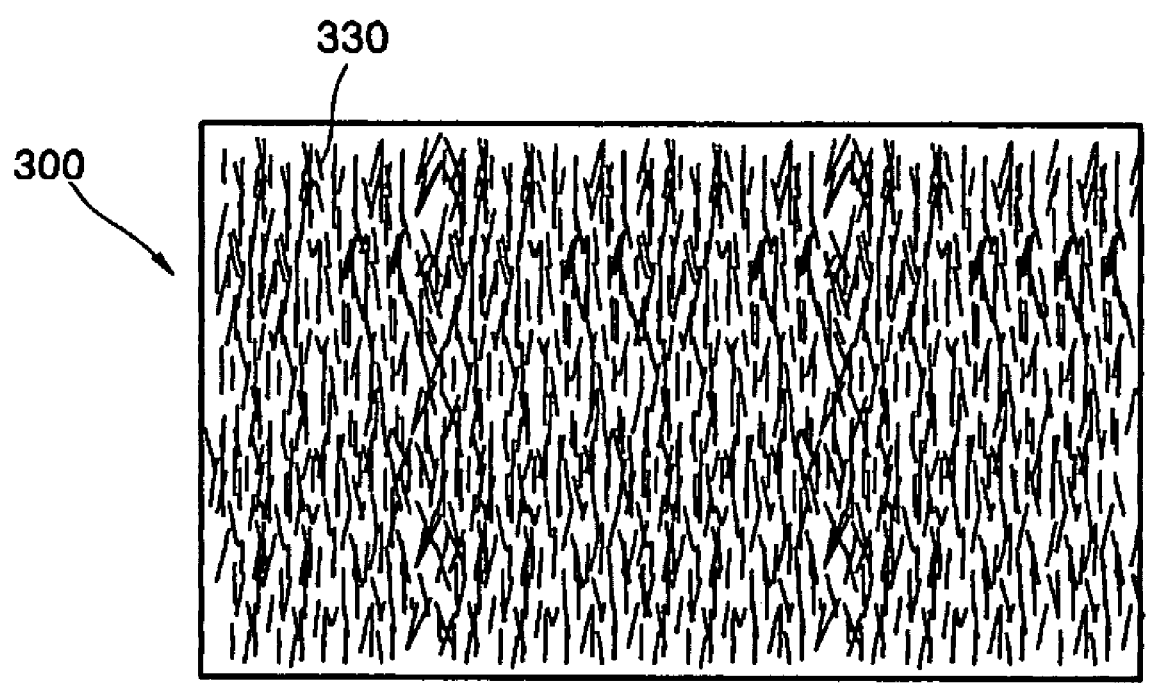
FIG. 13 is a plane view of the donor sheet manufactured by the method shown in FIGS. 8 through 12.

Turning now to FIGS. 6A through 13, FIGS. 6A through 6C illustrate a method of forming patterned nanolayers 125 and 126 as illustrated in FIG. 5 by an LITI method, and FIG. 7 illustrates a cross-section of a donor sheet in the method shown in FIGS. 6A through 6C. FIGS. 8 through 12 illustrate an example of a method of manufacturing the donor sheet, and FIG. 13 illustrates the plane of the donor sheet manufactured by the method shown in FIGS. 8 through 12.

First, in the method of forming the nanolayers by the LITI method, a donor sheet 300 shown in FIG. 7 is used. Nanowires 330 of the donor sheet 300 are arranged to be parallel to their lengthwise directions on a film 310, thus forming a transfer layer 320.

The film 310 includes a base film 312 and a light-to-heat conversion (LTHC) layer 314. A polyolefin-based resin may be used as the base film 312. The LTHC layer 314 may be coated on the base film 312 by agitating carbon in acryl but is not limited to this. The LTHC layer 314 may be a layer that transfers the transfer layer 320 by converting laser light into heat and heating the transfer layer 320. The donor sheet 300 may be manufactured by the method shown in FIGS. 8 through 12.

Figure 9:
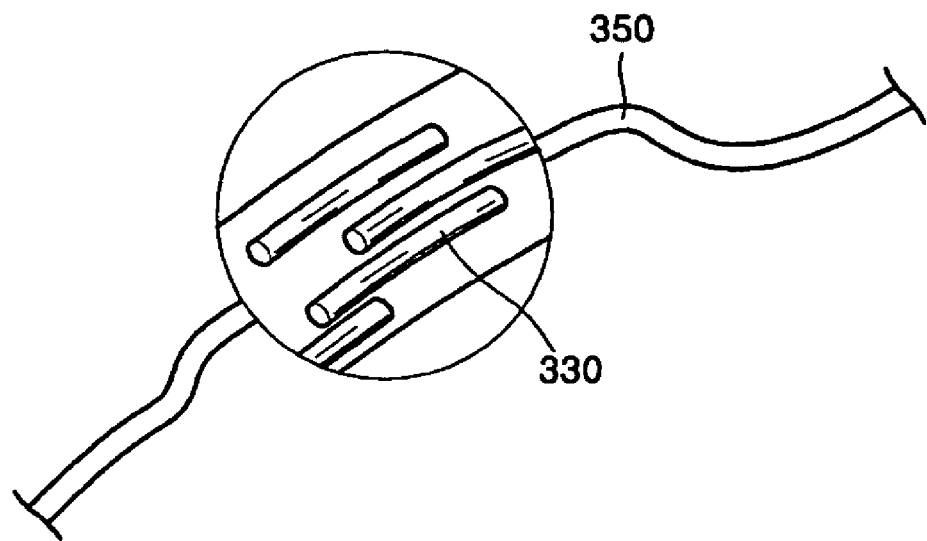
Figure 10:
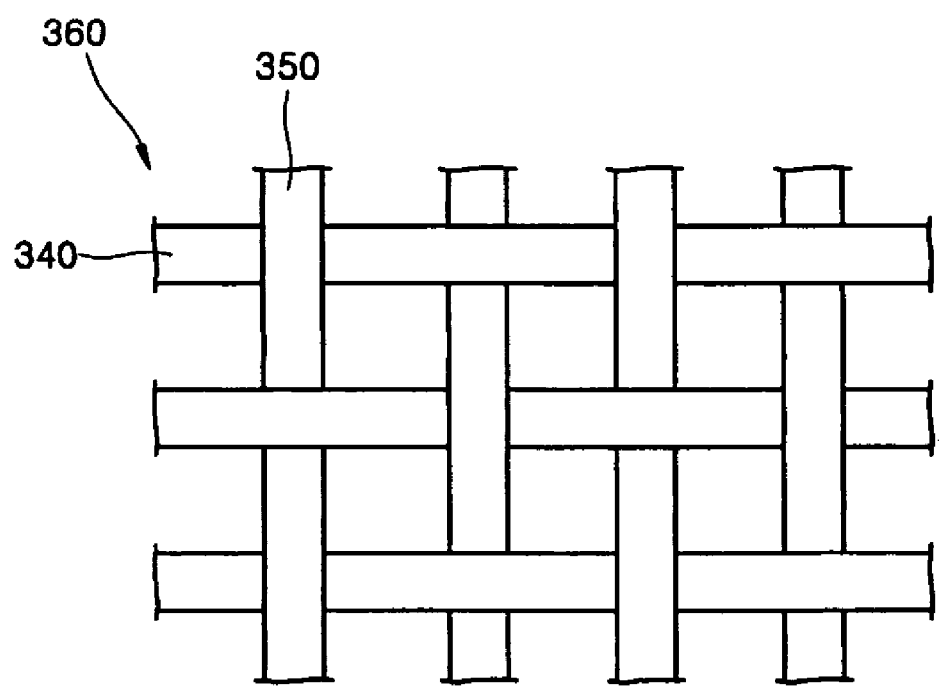

First, first and second fibers 340 and 350 are formed of a high molecular material. As shown in FIGS. 10 and 11, the first fibers 340 become either wefts or warps when forming a woven fabric, are formed of only a high molecular material, and do not include the nanoparticles 330. The second fibers 350 become either warps or wefts respectively that cross the first fibers and are approximately perpendicular to the first fibers 340. As shown in FIG. 9, the plurality of nanoparticles 330 are arranged in the second fibers 350 and are approximately parallel to each another.

Warp and weft are terms from weaving. The threads or yarns that run lengthwise on the loom are called the warp, the crosswise threads or yarns are called the woof or weft. The web is the name given the completed woven fabric. A loom is a device for holding a set of threads or yarns in sequence, parallel, and under tension (the warp) so that other yarns may be interlaced with them at right angles (weft). This process of interlacing warp and weft yarns on a loom is called weaving.

Figure 8:
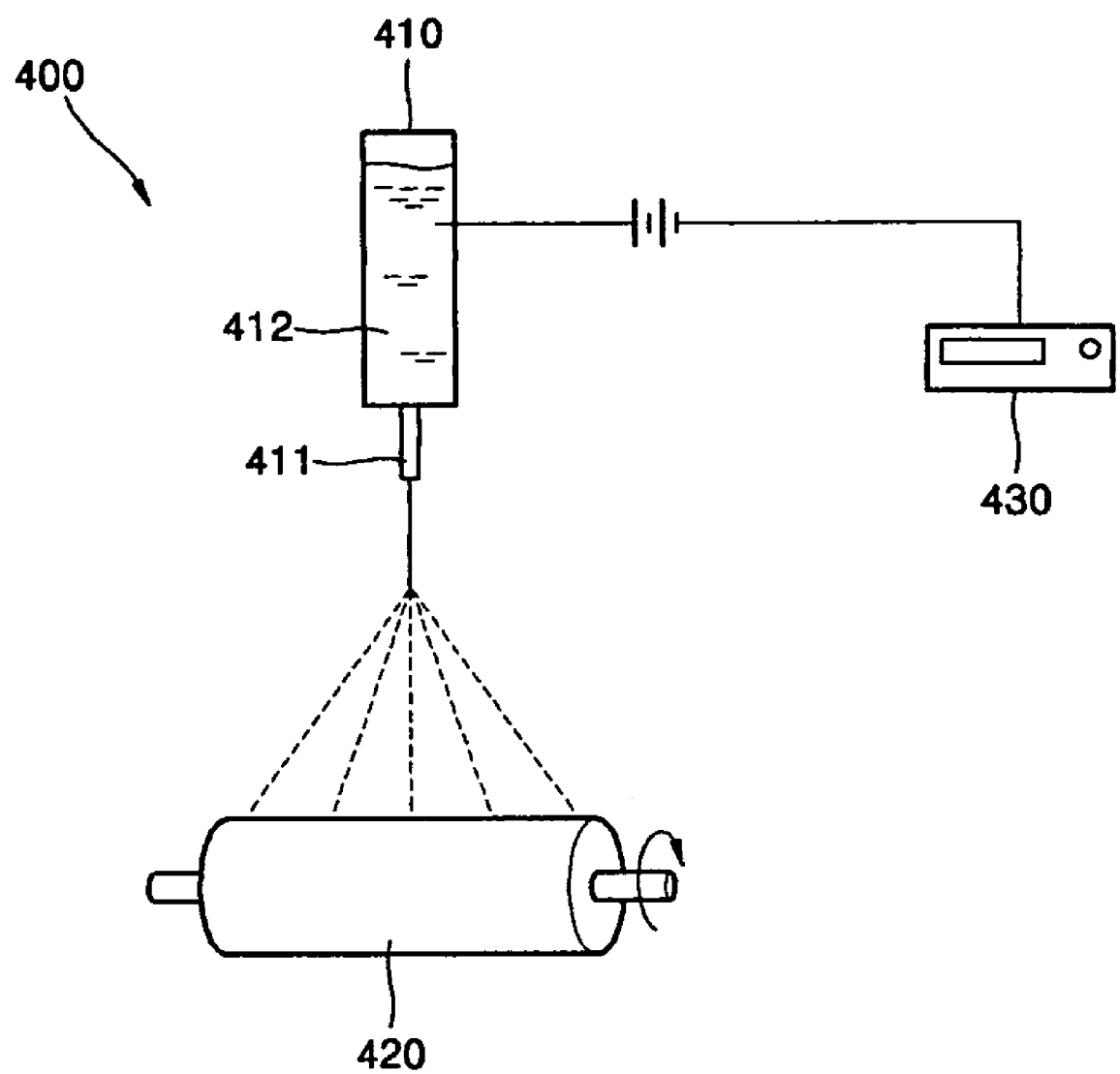
FIGS. 8 through 12 illustrate a method of manufacturing the donor sheet shown in FIG. 7 according to an embodiment of the present invention.

The first and second fibers 340 and 350 may be manufactured by an electro-spinning method shown in FIG. 8, but the present invention is in no way limited to this as the first and the second fibers 340 and 350 may be manufactured by a variety of methods. A method of manufacturing the first and second fibers 340 and 350 using electro-spinning will now be described.

An electro-spinning apparatus 400 shown in FIG. 8 includes an injector 410 having a nozzle 411, a power supply 430 which applies a radio frequency (RF) power to the injector 410, and 8 a collector 420 which forms nano-sized fibers using a high molecular solution injected from the nozzle 411. A predetermined amount of the high molecular solution 412 is injected into the injector 410, and the high molecular solution 412 is sprayed onto the collector 420 while the collector 420 is rotated in a state where the RF power is applied to the high molecular solution 412. Fibers are drawn in the collector 420 and wound therearound. When the first fibers 340 are formed, nanoparticles are not present in the high molecular solution 412. When the second fibers 350 are formed, a high molecular solution 412 contains nanoparticles.

The nanoparticles are small particles of any one of a variety of materials, such as a group IIIB-VIA compound including CdS, CdSe, and CdTe, a group IIIA-VA compound including GaAs, a group IVA element including Si and a compound thereof, and metals including Ni, Co, Fe, Pt, Au, and Ag and a compound thereof. However, the nanoparticles are not limited to the above and may be formed of other materials.

These nanoparticles can be formed by physical and chemical methods, and methods of forming the nanoparticles will be described in the following.

The nanoparticles may be formed by chemical methods and have a core that is made out of a group IIIB-VIA compound including CdS, CdSe, and CdTe, a group IIIA-VA compound including GaAs, a group IVA element including Si and a compound thereof, and metals including Ni, Co, Fe, Pt, Au, and Ag and a compound thereof and any one of the compounds with which the core is coated. As an example, a first operation of forming (CdSe)ZnS nanoparticles is making CdSe nanocrystals. It is well-known that the size of the nanoparticles is approximately 23-55 Å and a difference in distribution of the size is approximately 5-10%. These CdSe nanoparticles are formed by performing a high-temperature colloid growth processing process and a precipitation process of selecting the size of the nanoparticles. Here, the high-temperature colloid growth processing process is a process in which an organic metallic precursor is quickly injected into a high-temperature solvent and a homogeneous nucleus is instantaneously generated. The organic metallic precursor used as a Cd source includes an alkali cadmium compound such as $CdMe_2$. Proper organic metallic compounds used as a Se source are tri-alkyl phosphine selenide such as $(TMS)_2Se$, TOPSe, and TBPSe. Subsequently, the CdSe particles are coated with a solution including Zn and S precursors in a solvent (for example, TOP) at an appropriate temperature. Ditylzinc and hexamethyldisilatine are used as Zn and S precursors.

The nanoparticles may also be formed by a variety of physical methods such as vacuum synthesis, gas-phase synthesis, condensed phase synthesis, high-speed deposition using an ionized cluster beam, consolidation, high-speed milling, mixalloy processing, deposition, and Sol-Gel processing.

However, the method of forming nanoparticles is not limited to the above-described methods. Also, the nanoparticles may have shapes such as nanowires, nano-ribbons, nanorods, or nanotubes having a single wall or multiple walls.

The nanoparticles may also be formed by the following methods.

(a) P-Type Si Nanowires

P-type Si nanowires having the thickness of 20-40 nm are composed by thermal deposition of $SiH_4$ and $B_2H_6$ using mono-dispersed gold colloid particles (manufactured by British Biocell International Ltd) as a catalyst. In this case, a temperature is between 420 and 480° C., and a reactor is adjusted so that computer-controlled growth can be performed in an 8-inch tube furnace. When a total pressure is 30 torr, a partial pressure of silane is about 2 torr, and a reaction time is 40 minutes. The ratio of $SiH_4$ to $B_2H_6$ is adjusted to be 6400:1 in consideration of a doping level. In this case, the doping concentration of nanowires is estimated to about $4 \times 10$ E+17 cm$^{-3}$. As the doping level increases, a contact resistance becomes lower without having to perform a high-temperature annealing process. See Nature, 425, 274-278 (2003).

(b) N-Type Si Nanowires

N-type Si nanowires are made by laser-assisted catalytic growth (LCG). Simply, the N-type Si nanowires are composed by ablating a gold target using a laser beam of Nd:YAG laser (532 nm; pulse width of 8 ns, 300 mJ/pulse, 10 Hz). Catalytic particles of gold nanocluster generated by this simple method react with a $SiH_4$ gas in a reaction container and are grown to Si nanowires. In the case of doping, the N-type Si nanowires are generated by disposing Au-P target (99.5:0.5 wt %, Alfa Aesar) and additional red phosphorous (99% Alfa Aesar) in a gas inlet of the reaction container. See J. Phys. Chem. B., 104, 5213-5216 (2000).

(c) N-Type GaN Nanowires

N-type GaN nanowires are formed by metal-catalyzed CVD using each of an ammonia gas (99.99%, Matheson), gallium metal (99.9999%, Alfa Aesar), and magnesium nitride ($Mg_3N_2$, 99.6%, Alfa Aesar) as a source of N, Ga, and Mg. In this case, a c-plane sapphire substrate is preferably used. $Mg_3N_2$ is thermally decomposed into $MgN_2(s)=3$ $Mg(g)+N_2(g)$, causes an Mg dopant, and is placed upstream of a Ga-source. GaN nanowires are formed at 950° C., and nickel is used as a catalyst. The GaN nanowires generally have a length of 10-40 μm. See Nano Letters, 3 (3), 343-346 (2003).

(d) N-Type CdS Nano-Ribbons

CdS nano-ribbons are composed by vacuum vapor transport. In particular, a small amount of CdS powder (less than 100 mg) is sealed at an end of a vacuum tube. While the vacuum tube is heated so that the temperature of the CdS powder is 900° C., the temperature of the other end of the vacuum tube is lower than 50° C. Within 2 hours, most CdS powders are moved to a cold place and stuck on walls of the vacuum tube. The materials are mostly nano-ribbons having the thickness of 30-150 nm. The nano-ribbons have the width of 0.5-5 μm and the length of 10-200 μm. See Nature, 425, 274-278 (2003).

(e) Ge Nanowires $H_2$ (total atmosphere=1 atm) is flown at a speed of 100 sccm in a furnace reactor having a diameter of 2.5 cm and simultaneously, the speed of $GeH_4$ (10% in He) is 10 sccm, and CVD is performed for 15 minutes at 275° C., thus forming Ge nanowires. A reaction substrate is a substrate in which Au nanocrystals (having a diameter of 20 nm on the average) are uniformly dispersed onto the surface of an $SiO_2$ substrate. See Agnew. Chem. Int. Ed. Engls, 41, 4783-4786 (2002).

(f) InP Nanowires

InP nanowires are formed by LCG. A LCG target is generally composed of 94% InP, 5% Au catalyst, and 1% Te or Zn doping element. While the LCG target is grown, the temperature of a furnace is 800° C. (medium), and the LCG target is placed at an upstream end of the furnace. Pulses of Nd-YAG laser (having the wavelength of 1064 nm) are emitted for 10 minutes. In this case, nanowires are collected at a downstream end of a cold place of the furnace. See Nature, 409, 66-69 (2001).

(g) ZnO Nanorods

Zinc acetate dihydrate ($ZnOCOCH_3$-$2H_2O$) approximately 29.5 g (0.13 mol) is melt in methanol 125 mL at 60° C., and then a solution in which potassium hydroxide (KOH) 14.8 g (0.23 mol) is melt is added to methanol 65 ml, thus forming ZnO nanorods. A reaction mixture is agitated at 60° C. four several days. If the nanorods are precipitated within several days, a precipitation is washed with methanol and centrifugally separated at 5500 rpm for 30 minutes. Nanoparticles, which are resultant materials caused by the above-described procedure, are diluted using a solvent having the ratio of ethylene glycol to water 2:1 and become a solution. By ripening the solution for about three days, nanorods having a diameter of 15-30 nm and a length of 200-300 nm are formed. On the other hand, nanowires can also be formed by CVD. See Nano Letters, 3 (8), 1097-1101 (2003).

When the second fibers 350 are formed using the high molecular solution containing the nanoparticles, the nanoparticles contained in the second fibers 350 are aligned in a drawn direction of the second fibers 350, as shown in FIG. 9. Accordingly, the nanoparticles 330 arranged to be parallel to one another can be formed.

Next, as shown in FIGS. 10 and 11, a woven fabric 360 is formed in such a way that the first fibers 340, in which the nanoparticles 330 are not contained, and the second fibers 350, in which the nanoparticles 330 are contained, cross each other. Since the nanoparticles 330 are contained only in the second fibers 350 of the woven fabric 360, as a result, the nanoparticles 330 are arranged to be parallel to a direction in which the second fibers 350 is arranged.

Thus, as shown in FIG. 12, if the woven fabric 360 is laminated to the film 310 in which a light-to-heat conversion (LTHC) layer 314 is formed, as shown in FIG. 13. The donor sheet 300 in which the nanoparticles 330 are arranged to be approximately parallel to one another can be manufactured. The laminating operation is performed in a state where the woven fabric 360 is closely attached to the LTHC layer 314 of the film 310.

In the method of manufacturing the donor sheet 300, since the woven fabric 360 is manufactured in a roll shape, many donor sheets 300 can be continuously formed using the woven fabric 360, resulting in improved productivity. As shown in FIG. 6A, the donor sheet 300 is seated on the substrate 100 in which the buffer 110 is formed. As shown in FIG. 6B, the donor sheet 300 and the substrate 100 are laminated to each other and provisionally bonded to each other. If in this state, a laser beam is emitted to a predetermined portion in which a pattern is to be formed, and the donor sheet 300 and the substrate 100 are separated from each other, a predetermined pattern is formed on the substrate 100, as shown in FIG. 6C.

Thus, as shown in FIG, 5, one of the P-type nanolayer 125 and the N-type nanolayer 126 can be formed. If the laser patterning is performed in a state where a donor sheet in which nanowires having another shape are aligned is shifted by one line, another nanolayer can be formed. In this way, as shown in FIG. 5, the nanolayers 125 and 126 are formed along the nanoparticles 120, patterned to form an active layer pattern shown in FIG. 4, and by performing subsequent processes such as a process of manufacturing a TFT and a process of manufacturing an OLED, the OLED can be manufactured, as shown in FIG. 3.

The structure having the nano-TFT need not be a stacked structure shown in FIG. 3. After the gate electrodes 141, 142, 143, and 144 are first formed on the buffer layer 110 of the substrate 100, a gate insulating layer 150 is formed to cover them, and the nanolayers 125 and 126 shown in FIG. 5 may be formed on the gate insulating layer 150.

As described above, a laser transfer method has been described as an example, but the present invention is not limited to this and the transfer layer of the donor sheet may be transferred by not laser but external pressure. In this case, a general transfer method may be applied to the present invention without any change.

As shown in FIG. 5, the nanolayers 125 and 126 are formed along the nanoparticle lines 120 and patterned, thus forming the active layers shown in FIG. 4. However, the present invention is not limited to this, and the active layers shown in FIG. 4 may be directly formed using the donor sheet without forming the nanolayers 125 and 126 shown in FIG. 5. That is, by using the above-described method, as shown in FIG. 13, the P-type or N-type donor sheet 300 is formed and then is provisionally bonded to the substrate 100, and the transfer layer of the donor sheet 300 is transferred only in a position in which the active layers on the nanoparticle lines 120 are to be formed, thus directly patterning the nanolayers 125 and 126.

Figure 14:
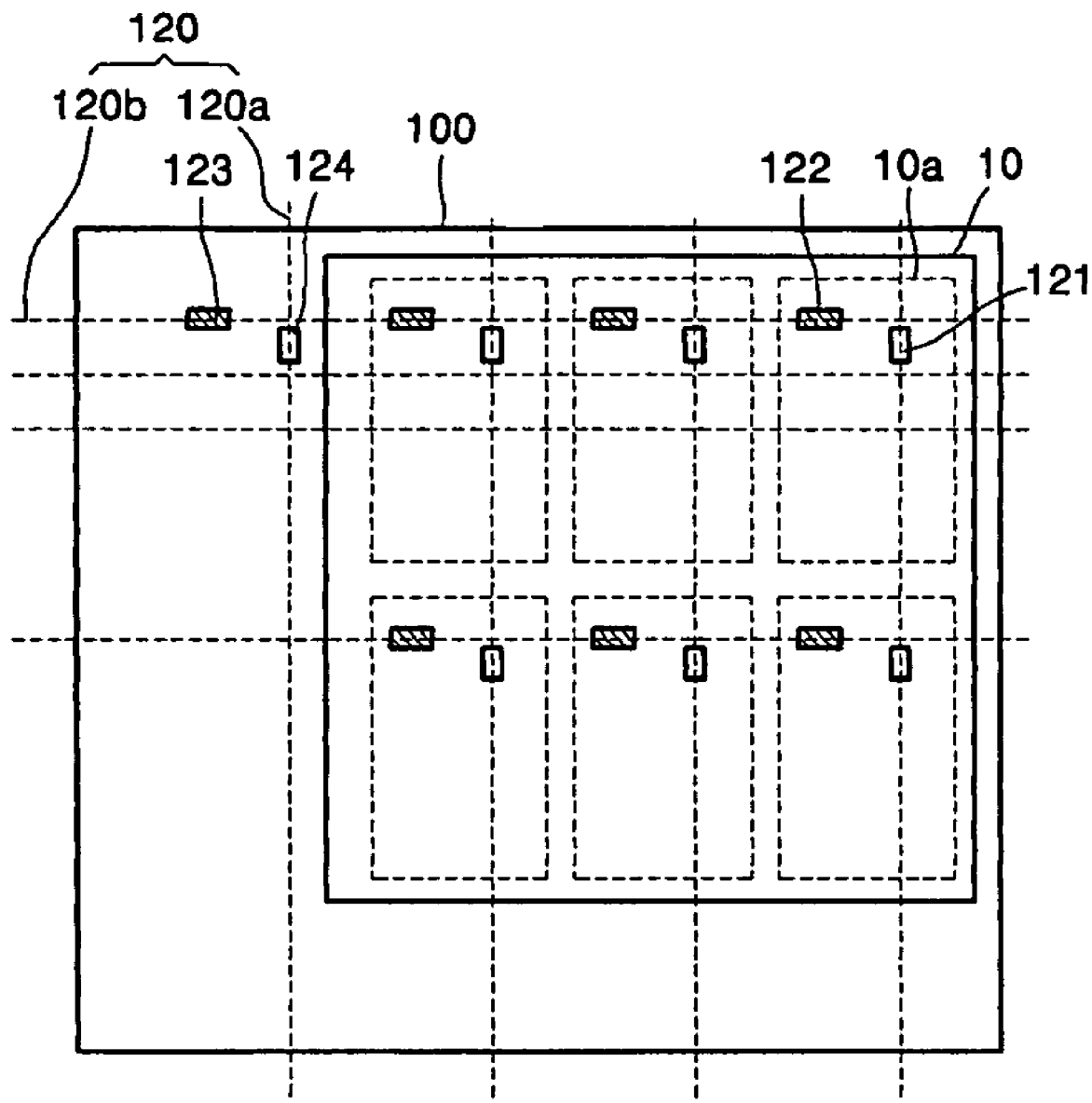
FIG. 14 is a schematic plane view of an active layer of a flat panel display device according to another embodiment of the present invention.

As shown in FIGS. 4 and 5, the P-type nanoparticle lines 120a and the N-type nanoparticle lines 120b can be alternately arranged to be parallel to one another. In addition, as shown in FIG. 14, the P-type nanoparticle lines 120a and the N-type nanoparticle lines 120b can be arranged to cross one another. In this case, the active layer 121 of the driving TFT may be a P-type and the active layer 122 of the switching TFT may be an N-type but is not limited to this and may be changed according to design of a selection driving circuit of a unit pixel.

As described above, the same type of TFTs among the TFTs disposed in the emission region 10 and the non-emission region 20 are disposed in such a way that lengthwise directions of at least their channel regions are parallel to one another. That is, as shown in FIG. 4, the active layers 121 of the driving TFT 11 and the active layers 124 of the P-type TFT 23 of the CMOS TFT 21, which are active layers of the P-type TFT, are arranged and installed to be parallel to one another, and the active layers 122 of the switching TFT 12 and the active layers 123 of the N-type TFT 22 of the CMOS TFT 21, which is an active layer of the N-type TFT 22, are arranged and installed to be parallel to one another. In addition, the P-type and the N-type can be arranged and installed to cross each other as in FIG. 14.

Even when the P-type nanoparticle lines 120a and the N-type nanoparticle lines 120b are arranged to cross one another, the above-described methods can be used. That is, in the transfer method including the LITI method shown in FIGS. 6A through 6C, a nanolayer is formed only in a portion of a corresponding active layer, thus forming the active layer.

The present invention is not limited to an OLED display, but can be applied to a variety of flat panel display devices having TFTs such as a liquid crystal display (LCD), an inorganic light-emitting diode, and a LED.

As described above, the present invention has the following effects. First, by using nanoparticles in a channel of a TFT, a TFT, a flat panel display device having the same, in particular, an organic light-emitting diode (OLED) display can be manufactured at room temperature or low temperature without performing a high-temperature process. Second, as a result, plastic materials having low heat resistance can be used in a flat panel display device, in particular, an OLED display. Accordingly, the present invention is more advantageous to the manufacture of a flexible flat panel display device. Third, a channel is formed using nanoparticles arranged in a lengthwise direction such that mobility can be further improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A donor sheet, comprising:
   a base film; and
   a transfer layer arranged at one side of the base film and being transferable, wherein the transfer layer comprises a plurality of nanoparticles that are arranged to be approximately parallel to one another, wherein the transfer layer comprises a woven fabric comprising a plurality of warps and wefts, the nanoparticles being in one of the warps and wefts.

2. A donor sheet, comprising:
   a base film; and
   a transfer layer arranged at one side of the base film and being transferable, wherein the transfer layer comprises a plurality of nanoparticles that are arranged to be approximately parallel to one another, wherein the nanoparticles are P-type or N-type semiconductors.

3. A method of manufacturing a donor sheet, comprising:
preparing a film;
forming first high molecular fibers;
forming second high molecular fibers comprising a plurality of nanoparticles arranged approximately in parallel to each other;
forming a woven fabric so that the first fibers and the second fibers cross one another; and
laminating the woven fabric to the film.

4. The method of claim 3, wherein the nanoparticles are P-type or N-type semiconductors.

5. The method of claim 3, wherein the nanoparticles are selected from the group consisting of nanowires, nanorods and nano-ribbons.

6. A method of manufacturing a thin film transistor, the method comprising:
partitioning a plurality of nanoparticle lines;
preparing a donor sheet comprising a transfer layer on a woven fabric comprising a plurality of nanoparticles arranged to be approximately parallel to each other; and
forming an active layer by aligning the donor sheet to a substrate so that the nanoparticles of the donor sheet are parallel to the nanoparticle lines, and transferring the transfer layer of the donor sheet along the nanoparticle lines to the substrate.

7. The method of claim 6, wherein the forming of the active layer comprises:
forming nanolayers on a line by transferring the transfer layer from the donor sheet along the nanoparticle lines; and
forming an active layer by patterning the nanolayers.

8. The method of claim 6, wherein the nanoparticle lines are alternately arranged so that the P-type nanoparticle lines and the N-type nanoparticle lines are parallel to one another, and the nanolayers comprise P-type nanolayers and N-type nanolayers, the P-type nanolayers and the N-type nanolayers respectively are formed along the P-type nanoparticle lines and the N-type nanoparticle lines.

9. The method of claim 6, wherein the nanoparticle lines are arranged so that the P-type nanoparticle lines and the N-type nanoparticle lines cross one another, and the nanolayers comprise P-type nanolayers and N-type nanolayers, the P-type nanolayers and the N-type nanolayers respectively are formed along the P-type nanoparticle lines and the N-type nanoparticle lines.

10. The method of claim 6, wherein the lengthwise direction of each of the nanoparticles is parallel to the lengthwise direction of each of the nanolayers.

11. The method of claim 6, wherein the nanoparticles are selected from the group consisting of nanowires, nanorods and nano-ribbons.

12. The method of claim 6, wherein at least one of the nanoparticle lines has a striped shape.

13. The method of claim 6, wherein the preparing a donor sheet comprising a transfer layer on a woven fabric comprises:
preparing a film;
forming first high molecular fibers;
forming second high molecular fibers comprising a plurality of nanoparticles arranged to be approximately parallel to one another;
forming a woven fabric so that the first fibers and the second fibers cross one another; and
laminating the woven fabric to the film.

14. A method of manufacturing a flat panel display, the method comprising:

providing a flat panel display device comprising an emission region in which a plurality of pixels are arranged and a selection driving circuit comprising a thin film transistor comprising a semiconductor active layer arranged in each of the pixels;
partitioning a plurality of nanoparticle lines;
preparing a donor sheet comprising a transfer layer on a woven fabric in which a plurality of nanoparticles are arranged to be approximately parallel to each other; and
forming the active layer by aligning the donor sheet to a substrate, the substrate being the acceptor, so that the nanoparticles of the donor sheet are parallel to the nanoparticle lines, and transferring the transfer layer from the donor sheet to the substrate along the nanoparticle lines.

15. The method of claim 14, wherein the forming of the active layer comprises:
forming nanolayers on a line by transferring the transfer layer of the donor sheet along the nanoparticle lines; and
forming an active layer by patterning the nanolayers.

16. The method of claim 14, wherein the nanoparticle lines are alternately arranged so that the P-type nanoparticle lines and the N-type nanoparticle lines are parallel to one another, and the nanolayers comprise P-type nanolayers and N-type nanolayers, the P-type nanolayers and the N-type nanolayers respectively are formed along the P-type nanoparticle lines and the N-type nanoparticle lines.

17. The method of claim 14, wherein the nanoparticle lines are arranged so that the P-type nanoparticle lines and the N-type nanoparticle lines cross one another, and the nanolayers comprise P-type nanolayers and N-type nanolayers, the P-type nanolayers and the N-type nanolayers respectively are formed along the P-type nanoparticle lines and the N-type nanoparticle lines.

18. The method of claim 14, wherein the lengthwise direction of each of the nanoparticles is parallel to the lengthwise direction of each of the nanolayers.

19. The method of claim 14, wherein the nanoparticles are selected from the group consisting of nanowires, nanorods and nano-ribbons.

20. The method of claim 14, wherein at least one of the nanoparticle lines has a striped shape.

21. The method of claim 14, wherein the preparing a donor sheet comprising a transfer layer on a woven fabric comprises:
preparing a film;
forming first high molecular fibers;
forming second high molecular fibers comprising a plurality ofnanoparticles arranged to be approximately parallel to one another;
forming a woven fabric so that the first fibers and the second fibers cross one another; and
laminating the woven fabric to the film.

22. The method of claim 14, further comprising forming an organic light-emitting diode in each of the pixels, each organic light-emitting diode comprises one electrode being electrically connected to the selection driving circuit.

23. The method of claim 5, further comprised of:
providing a flat panel display device comprising an emission region in which a plurality of pixels are arranged and a selection driving circuit comprising a thin film transistor comprising a semiconductor active layer arranged in each of the pixels;
partitioning a plurality of nanoparticle lines;
selecting a donor sheet comprised of a transfer layer on the woven fabric; and forming the active layer by aligning the donor sheet to a substrate so that the nanoparticles of the donor sheet are parallel to the nanoparticle lines, and transferring the transfer layer of the donor sheet along the nanoparticle lines to the substrate.

24. The method of claim 6, further comprised of providing a flat panel display device comprising an emission region in which a plurality of pixels are arranged and a selection driving circuit comprising a semiconductor thin film transistor comprised of the active layer arranged in each of the pixels.

25. A method of manufacturing a flat panel display with the donor sheet of claim 1, comprised of:
    providing a flat panel display device comprising an emission region in which a plurality of pixels are arranged and a selection driving circuit comprised of a thin film transistor comprising a semiconductor active layer arranged in each of the pixels;
    partitioning a plurality of nanoparticle lines; and
    forming the active layer by aligning the donor sheet to the base layer so that the nanoparticles of the donor sheet are parallel to the nanoparticle lines, and transferring the transfer layer of the donor sheet along the nanoparticle lines to the base layer.

26. A method of manufacturing a flat panel display with the thin-film transistor of claim 8, comprised of:
    providing a flat panel display device comprising an emission region in which a plurality of pixels are arranged and a selection driving circuit comprised of the thin film transistor comprising a semiconductor active layer arranged in one of the pixels.

27. A method of manufacturing a flat panel display with the thin-film transistor of claim 9, comprised of:
    providing a flat panel display device comprising an emission region in which a plurality of pixels are arranged and a selection driving circuit comprised of the thin film transistor comprising a semiconductor active layer arranged in one of the pixels.

28. A method of manufacturing a flat panel display with donor of claim 1, comprised of:
    providing a flat panel display device comprising an emission region in which a plurality of pixels are arranged and a selection driving circuit comprised of a thin film transistor comprising a semiconductor active layer arranged in each of the pixels;
    partitioning a plurality of nanoparticle lines;
    preparing a donor sheet comprised of the transfer layer on the woven fabric; and
    forming the active layer by aligning the donor sheet to a substrate, the substrate being the acceptor, so that the nanoparticles of the donor sheet are parallel to the nanoparticle lines, and transferring the transfer layer from the donor sheet to the substrate along the nanoparticle lines.

29. A method of manufacturing a flat panel display with the donor sheet of claim 4, the method comprising:
    providing a flat panel display device comprising an emission region in which a plurality of pixels are arranged and a selection driving circuit comprising a thin film transistor comprising a semiconductor active layer arranged in each of the pixels;
    partitioning a plurality of nanoparticle lines; and
    forming the active layer by aligning the donor sheet to a substrate, the substrate being the acceptor, so that the nanoparticles of the donor sheet are parallel to the nanoparticle lines, and transferring the transfer layer from the donor sheet to the substrate along the nanoparticle lines.

* * * * *